US 11,750,199 B2
United States Patent
Mikhael et al.

(10) Patent No.: US 11,750,199 B2
(45) Date of Patent: Sep. 5, 2023

(54) QUADRATURE OSCILLATOR CIRCUITRY AND CIRCUITRY COMPRISING THE SAME

(71) Applicant: SOCIONEXT INC., Kanagawa (JP)

(72) Inventors: David Hany Gaied Mikhael, Langen (DE); Bernd Hans Germann, Langen (DE)

(73) Assignee: SOCIONEXT INC., Kanagawa (JP)

(*) Notice: Subject to any disclaimer, the term of this patent is extended or adjusted under 35 U.S.C. 154(b) by 0 days.

(21) Appl. No.: 17/824,537

(22) Filed: May 25, 2022

(65) Prior Publication Data
US 2022/0286089 A1 Sep. 8, 2022

Related U.S. Application Data

(62) Division of application No. 17/100,350, filed on Nov. 20, 2020, now Pat. No. 11,374,577.

(30) Foreign Application Priority Data

Nov. 29, 2019 (EP) .................................. 19212645

(51) Int. Cl.
*H03L 7/08* (2006.01)
*H03B 5/12* (2006.01)
(Continued)

(52) U.S. Cl.
CPC .......... *H03L 7/0805* (2013.01); *H03B 5/1215* (2013.01); *H03B 5/1228* (2013.01);
(Continued)

(58) Field of Classification Search
CPC ............ H03B 27/00; H03B 2200/0078; H03B 5/1228; H03B 5/1215; H03B 5/1212; H03L 7/099
See application file for complete search history.

(56) References Cited

U.S. PATENT DOCUMENTS 6,911,870 B2   6/2005  Gierkink et al.
7,551,038 B2   6/2009  Jang et al.
(Continued)

FOREIGN PATENT DOCUMENTS

GB     2 442 034 A         3/2008
KR     10-2007-0042135 A   4/2007
KR     10-2009-0072905 A   7/2009

OTHER PUBLICATIONS

Partial European Search Report issued in European Patent Application No. 19212645.6, dated May 28, 2020.
Extended European Search Report issued in European Patent Application No. 19212645.6, dated Sep. 2, 2020.
Jackson, Brad R., and Carlos E. Saavedra, "A 3 GHz CMOS quadrature oscillator using active superharmonic coupling," 2007 European Microwave Conference, IEEE, 2007 (Year: 2007).
(Continued)

*Primary Examiner* — Ryan Johnson
(74) *Attorney, Agent, or Firm* — McDermott Will & Emery LLP

(57) ABSTRACT

Quadrature oscillator circuitry, comprising: a first differential oscillator circuit having differential output nodes and configured to generate a first pair of differential oscillator signals at those output nodes, respectively; a second differential oscillator circuit having differential output nodes and configured to generate a second pair of differential oscillator signals at those output nodes, respectively; and a cross-coupling circuit connected to cross-couple the first and second differential oscillator circuits. The cross-coupling circuit may comprise a pair of cross-coupled transistors.

8 Claims, 11 Drawing Sheets

(51) Int. Cl.
  H03B 27/00    (2006.01)
  H03L 7/24     (2006.01)
  H03L 7/099    (2006.01)
(52) U.S. Cl.
  CPC ............ *H03B 27/00* (2013.01); *H03L 7/099* (2013.01); *H03L 7/24* (2013.01); *H03B 2200/0078* (2013.01)

(56) References Cited

U.S. PATENT DOCUMENTS

| | | |
|---|---|---|
| 8,258,887 B1 | 9/2012 | Nedovic |
| 8,957,739 B2 | 2/2015 | Lu et al. |
| 2008/0143446 A1* | 6/2008 | Yao ..................... H03B 5/1215 331/117 FE |
| 2012/0182078 A1 | 7/2012 | Lee et al. |

OTHER PUBLICATIONS

Ma, Minglin, Xiangliang Jin, and Zhijun Li, "Low voltage low-phase-noise SB-QLCO using second harmonics coupling technique," Journal of Communications Technology and Electronics 59.11 (2014): 1310-1314 (Year: 2014).

Ebrahimi, Emad, and Sasan Naseh, "A new robust capacitively coupled second harmonic quadrature LC oscillator," Analog Integrated Circuits and Signal Processing 66.2 (2011): 269-275 (Year: 2011).

Non-Final Office Action dated Nov. 3, 2021 issued in U.S. Appl. No. 17/100,350.

Notice of Allowance dated Mar. 3, 2022 issued in U.S. Appl. No. 17/100,350.

* cited by examiner

QUADRATURE OSCILLATOR CIRCUITRY AND CIRCUITRY COMPRISING THE SAME

CROSS-REFERENCE OF RELATED APPLICATIONS

This application is a divisional of U.S. patent application Ser. No. 17/100,350, filed on Nov. 20, 2020, which in turn claims the benefit of European Patent Application No. 19212645.6, filed on Nov. 29, 2019, the entire disclosures of which Applications are incorporated by reference herein.

The present invention relates to oscillator circuitry, in particular to quadrature oscillator circuitry comprising first and second differential oscillator circuits each configured to generate a pair of differential oscillator signals.

In such circuitry, the two pairs of differential oscillator signals are controlled such that they form a set of quadrature oscillator signals, i.e. signals mutually 90° out of phase with one another. Such signals may have relative phases of 0°, 90°, 180° and 270°, respectively, which may be referred to as I+, Q+, I− and Q− phases, respectively.

Such oscillator circuitry may be configured to be voltage controlled, where an input voltage control signal controls a frequency (operation frequency) of the oscillator signals, for example by controlling a resonant frequency of one or more LC tank circuits of the oscillator circuitry. Oscillator circuitry configured in this way may be referred to as a voltage-controlled oscillator (VCO), in particular a quadrature VCO where the two pairs of differential oscillator signals form a set of quadrature oscillator signals.

The present invention also relates to circuitry comprising such quadrature oscillator circuitry, such as a phase lock loop (PLL).

By way of background, FIG. 1 is a circuit diagram presenting previously-considered differential oscillator circuits 1, 100, 200, 1E, 100E and 200E, which are each configured to generate a pair of differential oscillator signals. Thus, any of these differential oscillator circuits may generate one of the two pairs of differential oscillator signals mentioned above, so that these differential oscillator circuits (and variations of them) may be used interchangeably. The present disclosure will be understood accordingly.

Differential oscillator circuit 1 comprises a first tail node 2, a second tail node 4 and a pair of parallel current paths 10, 20 which extend in parallel between the first tail node 2 and the second tail node 4. A pair of output nodes 12, 22 are located (e.g. mid-way) along the current paths 10, 20, respectively, at which a pair of differential oscillator signals OUT+ and OUT− (having relative phases of 0° and 180°, respectively) are generated.

A pair of cross-coupled transistors 14, 24, in this case NMOS field-effect transistors (FETs), are provided along the current paths 10, 20, respectively, between the respective output nodes 12, 22 and the first tail node 2, so that their channels form respective parts of those current paths. The source terminals of the transistors 14, 24 are connected together to the first tail node 2 and their drain terminals are connected to the output nodes 12, 22 respectively. The gate terminals of the transistors 14, 24 are connected to each other's drain terminals so that they form a cross-coupled pair.

Capacitors 16, 26 are connected between the output nodes 12, 22, respectively, and a voltage supply node, in this case ground supply (GND). Inductors 18, 28 are connected along the current paths 10, 20, respectively, between the respective output nodes 12, 22 and the second tail node 4, so that they form respective parts of those current paths 10, 20. The inductors 18, 28 may be implemented together as a centre-tapped inductor (winding/coil) whose centre tap (i.e. contact) is connected to the second tail node 4 and whose respective ends are connected to the output nodes 12, 22, as shown in FIG. 1.

A first tail current path 30 connects the first tail node 2 to a first voltage-source node 32, in this case ground supply (GND), and a second tail current path 40 connects the second tail node 4 to a second voltage-source node 42, in this case VDD. Thus, in this case, the first voltage-source node 32 may be (or be for connection to) a low-voltage source and the second voltage-source node 42 may be (or be for connection to) a high-voltage source. A current source 34 is located along (i.e. forms part of) the first tail current path 30 so as to regulate or control a bias current Ibias flowing along that current path 30 as indicated. The current source 34 thus also regulates or controls a bias current Ibias flowing along the second tail current path 40, that current being divided between the first and second current paths 10, 20.

In operation, the cross-coupled pair of transistors 14, 24 act as cross-coupled inverting amplifiers so as to force (or bias or urge) the voltages at the output nodes 12, 22 to be differential. The capacitors 16, 26 and inductors 18, 28 form parts of an LC tank circuit which then causes the voltages at the output nodes 12, 22 to oscillate at a frequency $f_0$ (resonant frequency) defined by the capacitance and inductance values of those components 16, 26, 18, 28. By implementing the capacitors 16, 26 as variable capacitors and/or the inductors 18, 28 as variable inductors, the frequency $f_0$ may be tuned (i.e. adapted by adapting the capacitance and/or inductance values). Where the values are adapted under voltage control (for example, by implementing the capacitors 16, 26 as a voltage controlled switched array of capacitors), the differential oscillator circuit 1 may be referred to as a VCO.

Of course, the skilled reader will recognize that the capacitors 16, 26 need not be provided between the output nodes 12, 22 and ground supply GND as indicated. An equivalent LC tank circuit could be implemented by placing those capacitors 16, 26 in series between the output nodes 12, 22. With this in mind, reference is made to differential oscillator circuit 100.

Differential oscillator circuit 100 is similar to differential oscillator circuit 1, and as such like elements are denoted by like reference signs and duplicate description is omitted. Differential oscillator circuit 100 differs from differential oscillator circuit 1 in that the capacitors 16, 26 are replaced with varactors (varactor diodes, or variable capacitance diodes) 116, 126, respectively, and in that those varactors are connected in series between the current paths 10, 20, effectively between the output nodes 12, 22. The parallel connection of the capacitors 18, 28 and the varactors 116, 126 form the LC tank circuit of the differential oscillator circuit 100.

A control voltage Vtune is applied to the node between the varactors 116, 126 as indicated. As is known, by varying the control voltage Vtune the capacitance of the varactors 116, 126 is varied, thereby varying (or tuning) the resonant frequency $f_0$ and thus the frequency of the differential oscillator signals OUT+ and OUT−. Differential oscillator circuit 100 may thus be referred to as a VCO.

Differential oscillator circuit 200 is also similar to differential oscillator circuit 1, and again like elements are denoted by like reference signs and duplicate description is omitted. Differential oscillator circuit 200 differs from differential oscillator circuit 1 in that the capacitors 16, 26 are replaced with a capacitor 316 connected between the current paths 10, 20, effectively between the output nodes 12, 22. Further, the inductors 18, 28 have been replaced with an inductor 318 also connected between the current paths 10, 20, effectively between the output nodes 12, 22 and in parallel with the capacitor 316. Also, a further pair of cross-coupled transistors 315, 325, in this case PMOS field-effect transistors (FETs), are provided along the current paths 10, 20, respectively, between the output nodes 12, 22 and the second tail node 4, so that their channels form respective parts of those current paths.

The source terminals of the transistors 315, 325 are connected together to the second tail node 4 and their drain terminals are connected to the output nodes 12, 22, respectively. The gate terminals of the transistors 315, 325 are connected to each other's drain terminals so that they form a cross-coupled pair. Like transistors 14, 24, the transistors 315, 325 act as cross-coupled inverting amplifiers. Indeed, the combination of the transistors 14, 24, 315, 325 act as a cross-coupled pair of CMOS inverters. The parallel connection of the capacitor 316 and inductor 318 form the LC tank circuit of the differential oscillator circuit 200.

Thus, it will be apparent that the operation of differential oscillator circuits 100, 200 corresponds to that of the differential oscillator circuit 1, and that differential oscillator signals are produced at the output nodes 12, 22, respectively. The capacitor 316 and/or inductor 318 could be tuneable for example to form a VCO. Thus, any of the differential oscillator circuits disclosed herein (and, by extension, any of the quadrature oscillator circuitry disclosed herein) could be implemented as a VCO. The present disclosure will be understood accordingly.

Differential oscillator circuit 1E is equivalent to differential oscillator circuit 1, with its LC tank circuit shown in schematic form as LC tank circuit 50, with the capacitors 16, 26 effectively assumed to be within that LC tank circuit 50 (i.e. as if they were connected in series between the output nodes 12, 22 as mentioned earlier). Similarly, differential oscillator circuit 100E is equivalent to differential oscillator circuit 100, with its LC tank circuit shown in schematic form as LC tank circuit (TC) 150, with the inductors 18, 28 and varactors 116, 126 effectively assumed to be within that LC tank circuit 150. Differential oscillator circuit 200E is equivalent to differential oscillator circuit 200, with its LC tank circuit shown schematically as LC tank circuit 250, with the capacitors 316 and inductors 318 effectively assumed to be within that tank circuit 250. The reference signs used for differential oscillator circuits 1, 100, 200 apply equally to circuits 1E, 100E, 200E where like elements are shown, but only a subset of those reference signs have been shown in the equivalent circuits for simplicity.

It will thus be appreciated that the present invention may be applied to a wide variety of differential oscillator circuit topologies, and that these may be represented in "full" as in circuits 1, 100, 200 or in "simplified form" as in circuits 1E, 100E, 200E. For convenience of explanation, the circuits 1 and 1E will be focussed on hereinafter but it will be understood as demonstrated in FIG. 1 that the techniques disclosed herein apply across the topologies. That is, where a differential oscillator circuit is disclosed later herein and is based on differential oscillator circuit 1, it will be appreciated that an equivalent differential oscillator circuit could be based on any of differential oscillator circuits 100, 200, 1E, 100E and 200E. Also, it will be apparent that other similar differential oscillator circuits could be arrived at by combining elements from circuits 100, 200, 1E, 100E and 200E, for example by employing the capacitors 16 and 26 in the circuit 200 in place of the capacitor 316, and are thus equally relevant.

Incidentally, although field-effect transistors (in this case, MOSFETs) are shown in FIG. 1, the circuits disclosed herein could also be implemented using bipolar junction transistors (BJTs). Also, the circuits shown could be implemented "upside down" using PMOS transistors in place of NMOS transistors, for example, and similar considerations apply to circuits employing BJTs. Further, although in general the current sources 34 usefully regulate bias currents as mentioned earlier, in some arrangements those current sources 34 may be considered optional. In some arrangements the current sources 34 could simply be omitted, and in other arrangements they could be replaced with resistors, but these are just examples.

As mentioned earlier, the present invention relates in particular to oscillator circuitry which generates two pairs of differential oscillator signals where the two pairs form a set of quadrature oscillator signals. FIG. 2 is a schematic diagram of previously-considered quadrature oscillator circuitry 300.

Oscillator circuitry 300 comprises an I-side differential oscillator circuit 310I and a Q-side differential oscillator circuit 310Q, here shown schematically, coupled together by a cross-coupling circuit 320. Both of these differential oscillator circuits 310I, 310Q may be implemented as any of the differential oscillator circuits of FIG. 1, for example. Taking the differential oscillator circuit 1 as a running example, the I+ and I− outputs of the differential oscillator circuit 310I correspond to the OUT+ and OUT− outputs, respectively, of one instance of the circuit 1, and the Q+ and Q− outputs of the differential oscillator circuit 310Q correspond to the OUT+ and OUT− outputs, respectively, of another instance of the circuit 1. Those outputs are then cross-coupled by virtue of the cross-coupling circuit 320.

The cross-coupling circuit 320 comprises Gm-cells (transconductance cells) 330 and 340, both of which could be implemented for example as in the implementation 330-1 of the cell 330 shown explicitly in FIG. 2. Cell 330 injects current into the current paths 10, 20 of the Q-side differential oscillator circuit 310Q that is proportional to the differential voltage output swing I+, I− of the I-side differential oscillator circuit 310I. Similarly, cell 320 injects current into the current paths 10, 20 of the I-side differential oscillator circuit 310I that is proportional to the differential voltage output swing Q+, Q− of the Q-side differential oscillator circuit 310Q but with inverted polarity (e.g. by reversing the connection of either the inputs Vin+, Vin− or the outputs Vout+, Vout−, for which see circuit 330-1). As a result of this injected current, the I-side and Q-side differential oscillator circuits 310I and 310Q are coupled together and are "forced" to work in quadrature.

However, the approach in FIG. 2 has drawbacks. The added Gm-cells 320, 330 are implemented (see circuit 330-1, for example) with active circuitry. Extra current is needed for these added cells that does not contribute to the actual oscillator gain or swing (i.e. I+, I−, Q+, Q−), which in turn increases the overall power consumption. Moreover, the added Gm-cells significantly increase the phase noise and deteriorate the oscillator performance.

It is desirable to solve such problems, in particular to provide more efficient and/or accurate quadrature oscillator circuitry.

According to an embodiment of a first aspect of the present invention, there is provided quadrature oscillator circuitry, comprising: first and second differential oscillator circuits, each differential oscillator circuit comprising first and second tail nodes, a pair of output nodes, and a pair of parallel current paths which extend in parallel between its first and second tail nodes via its output nodes, respectively, and each differential oscillator circuit configured to generate a pair of differential oscillator signals at its respective output nodes; and a cross-coupling circuit connected to cross-couple the differential oscillator circuits, wherein: for each of the differential oscillator circuits, a first tail current path connects the first tail node to a first voltage-source node and a second tail current path connects the second tail node to a second voltage-source node, one of the first and second voltage-source nodes for connection to a high-voltage source and the other of the first and second voltage-source nodes for connection to a low-voltage source; each of the differential oscillator circuits comprises a common-mode voltage node at which a common-mode voltage signal is produced, the common-mode voltage node either being an intermediate node of a potential divider connected between the parallel current paths (e.g. between the output nodes) of that differential oscillator circuit or being a node of the second tail current path of that differential oscillator circuit; and the cross-coupling circuit comprises, for at least one or each of the differential oscillator circuits, a current-control device which forms part of the first tail current path of that differential oscillator circuit and is configured to control the current flowing along that first tail current path based on the common-mode voltage signal of the other one of the differential oscillator circuits to cause the common-mode voltage signals of the respective differential oscillator circuits to be substantially in antiphase.

Such quadrature oscillator circuitry could be referred to simply as oscillator circuitry or an oscillator. When the frequency of the oscillator signals is controlled by a voltage control signal, the circuitry may be referred to as a VCO. Similar considerations apply to the other quadrature oscillator circuitry disclosed herein.

By causing the common-mode voltage signals of the respective differential oscillator circuits to be substantially in antiphase, the pairs of differential oscillator signals are controlled to form a set of quadrature oscillator signals.

The cross-coupling circuit may comprise an inverting amplifier configured, for at least one or each of the differential oscillator circuits, to control the current-control device of that differential oscillator circuit based on the common-mode voltage signal of the other one of the differential oscillator circuits. In this way, the desired antiphase relationship may be achieved.

The cross-coupling circuit may comprise first and second transistors as current-control devices for the first and second differential oscillator circuits, respectively. The first and second transistors may form respective parts of the first tail current paths of the first and second differential oscillator circuits, respectively, so that current flowing along the respective first tail current paths flows through the first and second transistors, respectively. The gate or base terminals of the first and second transistors may be connected to the common-mode nodes of the second and first differential oscillator circuits, respectively, so that they are controlled by the common-mode voltage signals produced at the common-mode nodes of the second and first differential oscillator circuits, respectively. In this way, the transistors may be cross-coupled and act as a pair of cross-coupled inverting amplifiers.

Each of the differential oscillator circuits may comprise a current source which forms part of its second tail current path and is configured to regulate a bias current flowing along that current path. The common-mode voltage nodes of the first and second differential oscillator circuits may be their second tail nodes or nodes of their second tail current paths between their second tail nodes and their current sources.

The gate or base terminals of the first and second transistors may be connected to the common-mode nodes of the second and first differential oscillator circuits, respectively, via impedances. Those impedances may be or comprise capacitors.

The common-mode voltage nodes of the first and second differential oscillator circuits may be the intermediate nodes of their respective potential dividers. In that case, for each of the differential oscillator circuits, its potential divider may comprise a potential-divider impedance connected between one of its parallel current paths (e.g. at one of the output nodes) and its intermediate node and another potential-divider impedance connected between the other one of its parallel current paths (e.g. at the other one of its output nodes) and its intermediate node. The potential-divider impedances may be or comprise capacitors.

Each of the differential oscillator circuits may comprise a current source which forms part of its second tail current path to regulate a bias current flowing along that current path.

The gate or base terminals of the first and second transistors may be connected via respective impedances (such as resistances, for DC biasing) to their drain or collector terminals or to a voltage-source node.

According to an embodiment of a second aspect of the present invention, there is provided quadrature oscillator circuitry, comprising: first and second differential oscillator circuits, each differential oscillator circuit comprising first and second tail nodes, a pair of output nodes, and a pair of parallel current paths which extend in parallel between its first and second tail nodes via its output nodes, respectively, and each differential oscillator circuit configured to generate a pair of differential oscillator signals at its respective output nodes; and a cross-coupling circuit comprising first and second transistors connected to cross-couple the differential oscillator circuits, wherein: for each of the differential oscillator circuits, a first tail current path connects the first tail node to a first voltage-source node and a second tail current path connects the second tail node to a second voltage-source node, one of the first and second voltage-source nodes for connection to a high-voltage source and the other of the first and second voltage-source nodes for connection to a low-voltage source; the first and second transistors are connected to form respective parts of the first tail current paths of the differential oscillator circuits, respectively, so that current flowing along the respective first tail current paths flows through the respective transistors; the gate or base terminals of the first and second transistors are connected to the first tail nodes of the second and first differential oscillator circuits, respectively, so that they are controlled by voltage signals produced at the first tail nodes of the second and first differential oscillator circuits, respectively; the first tail current paths extend from the first tail nodes via the first and second transistors, respectively, to a shared tail node; a shared tail current path connects the shared tail node to a shared voltage-source node, being the first voltage-source node of both of the differential oscillator circuits; each of said differential oscillator circuits comprises an LC tank circuit configured to have a target resonant frequency; and the quadrature oscillator circuitry comprises an auxiliary LC tank circuit shared by the differential oscillator circuits and configured to have a resonant frequency which is substantially twice the target resonant frequency.

The cross-coupling circuit comprising first and second transistors may act as cross-coupled inverting amplifiers. In particular, each of the transistors may act as a current-control device which forms part of the first tail current path of its differential oscillator circuit and be configured to control the current flowing along that first tail current path based on the first tail node voltage signal of the other one of the differential oscillator circuits to cause the first tail node voltage signals of the respective differential oscillator circuits to be substantially in antiphase. By causing the first tail node voltage signals of the respective differential oscillator circuits to be substantially in antiphase, the pairs of differential oscillator signals are controlled to form a set of quadrature oscillator signals.

The LC tank circuits of the differential oscillator circuits define the target resonant frequency and the auxiliary LC tank circuit shared by the differential oscillator circuits is configured to have a resonant frequency which is substantially twice the target resonant frequency so that the gain of the cross-coupling circuit is focussed at twice the target resonant frequency. DC gain and gain at an unwanted parasitic frequency of the cross-coupling circuit may also be avoided/attenuated in this way.

The first and second transistors may be connected as a cross-coupled pair of transistors. The auxiliary LC tank circuit may be connected between the first tail nodes or the first tail current paths of the differential oscillator circuits. The auxiliary LC tank circuit may be connected in parallel with the cross-coupled pair of transistors.

A shared current source or impedance may form part of the shared tail current path. Such a shared current source may be configured to regulate a bias current flowing along that current path.

The quadrature oscillator circuitry may comprise an auxiliary shared tail node. For each of the differential oscillator circuits, an auxiliary tail current path may form part of the auxiliary LC tank circuit and connect the first tail node to the auxiliary shared tail node via an auxiliary impedance (which is part of the auxiliary LC tank circuit). An auxiliary shared tail current path may connect the auxiliary shared tail node to an auxiliary shared voltage-source node. An auxiliary shared current source may form part of the auxiliary shared tail current path and be configured to regulate a bias current flowing along that current path. The auxiliary impedances may be or comprise inductors. The auxiliary impedances may be implemented together as a centre tapped inductor whose centre tap is the auxiliary shared tail node.

A capacitor may be connected in parallel with the auxiliary shared current source or the auxiliary shared tail current path, for example to filter out noise.

The auxiliary LC tank circuit may comprise a pair of first-node capacitors connecting the first tail nodes, respectively, to a voltage-source node. The pair of first-node capacitors may be implemented together as a single capacitor. The pair of first-node capacitors may be implemented as parasitic capacitances at the nodes concerned.

According to an embodiment of a third aspect of the present invention, there is provided quadrature oscillator circuitry, comprising: a first differential oscillator circuit having differential output nodes and configured to generate a first pair of differential oscillator signals at those output nodes, respectively; a second differential oscillator circuit having differential output nodes and configured to generate a second pair of differential oscillator signals at those output nodes, respectively; and a cross-coupling circuit comprising first and second transistors connected to cross-couple the first and second differential oscillator circuits. The first and second transistors may be connected as a cross-coupled pair of transistors.

According to an embodiment of a fourth aspect of the present invention, there is provided quadrature oscillator circuitry, comprising: first and second differential oscillator circuits, each differential oscillator circuit comprising first and second tail nodes, a pair of output nodes, and a pair of parallel current paths which extend in parallel between its first and second tail nodes via its output nodes, respectively, and each differential oscillator circuit configured to generate a pair of differential oscillator signals at its respective output nodes; and a cross-coupling circuit connected to cross-couple the differential oscillator circuits, wherein: for each of the differential oscillator circuits, a first tail current path connects the first tail node to a first voltage-source node and a second tail current path connects the second tail node to a second voltage-source node, one of the first and second voltage-source nodes for connection to a high-voltage source and the other of the first and second voltage-source nodes for connection to a low-voltage source; each of the differential oscillator circuits comprises a common-mode voltage node at which a common-mode voltage signal is produced, the common-mode voltage node either being an intermediate node of a potential divider connected between the output nodes of that differential oscillator circuit or being a node of the second tail current path of that differential oscillator circuit; and the cross-coupling circuit is connected to the common-mode nodes of the differential oscillator circuits and configured to control operation of one or both of the differential oscillator circuits to cause the common-mode voltage signals of the respective differential oscillator circuits to be substantially in antiphase.

In any of the aforementioned aspects, the pairs of differential oscillator signals of the first and second differential oscillator circuits may form a set of quadrature oscillator signals.

In any of the aforementioned aspects, the quadrature oscillator circuitry may be IQ oscillator circuitry. In such a case, the first differential oscillator circuit may be an I-side differential oscillator circuit, the pair of differential oscillator signals of the first differential oscillator circuit may be I+ and I− differential oscillator signals, respectively, the second differential oscillator circuit may be a Q-side differential oscillator circuit, and the pair of differential oscillator signals of the second differential oscillator circuit may be Q+ and Q− differential oscillator signals, respectively.

According to an embodiment of a fifth aspect of the present invention, there is provided phase lock loop circuitry comprising the quadrature oscillator circuitry of any of the aforementioned aspects.

According to an embodiment of a sixth aspect of the present invention, there is provided integrated circuitry, such as an IC chip, comprising the quadrature oscillator circuitry of any of the aforementioned first to fourth aspects or the phase lock loop circuitry of the aforementioned fifth aspect.

According to an embodiment of a seventh aspect of the present invention, there are provided analogue-to-digital converters (ADCs), digital-to-analogue converters (DACs), Serializer/Deserializer circuits (SERDES), Clock Data Recovery circuits (CDRs), Wireless Transceivers, Processors, or clocking circuitry comprising the quadrature oscillator circuitry of any of the aforementioned first to fourth aspects or the phase lock loop circuitry of the aforementioned fifth aspect.

According to an embodiment of an eighth aspect of the present invention, there is provided quadrature oscillator circuitry, comprising: a first differential oscillator circuit having differential output nodes and configured to generate a first pair of differential oscillator signals at those output nodes, respectively; a second differential oscillator circuit having differential output nodes and configured to generate a second pair of differential oscillator signals at those output nodes, respectively; and a cross-coupling circuit connected to cross-couple the first and second differential oscillator circuits. The cross-coupling circuit may comprise a pair of cross-coupled transistors.

Reference will now be made, by way of example, to the accompanying drawings, of which:

FIG. 1, as mentioned above, is a circuit diagram presenting previously-considered differential oscillator circuits;

FIG. 2, as mentioned above, is a schematic diagram of previously-considered quadrature oscillator circuitry;

FIG. 3 presents two graphs showing voltage waveforms of differential oscillator circuits by way of example;

Figure 3:
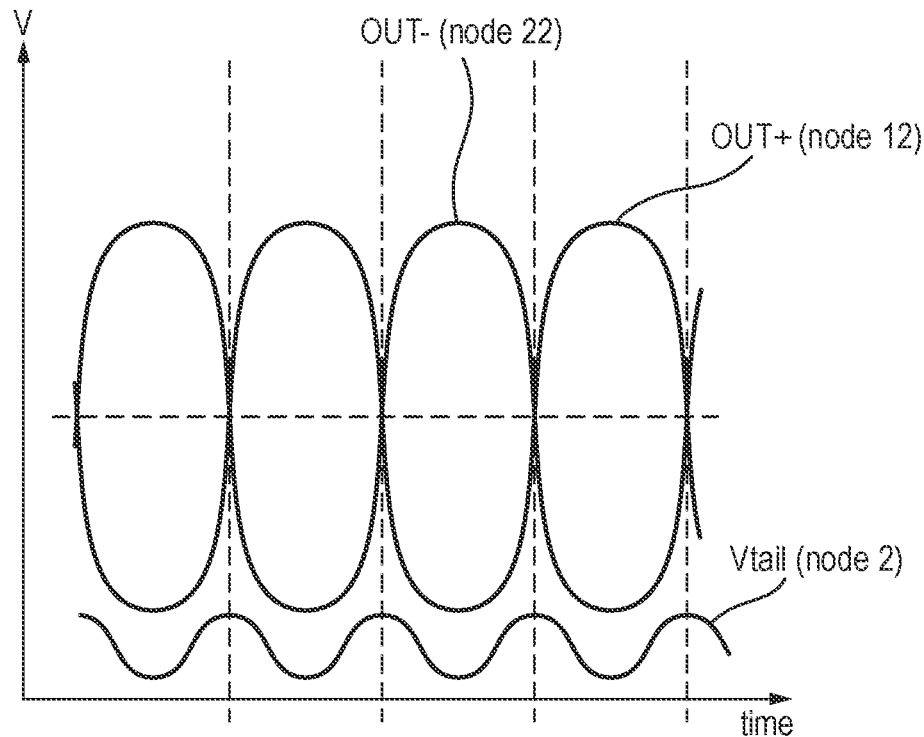
Figure 3:
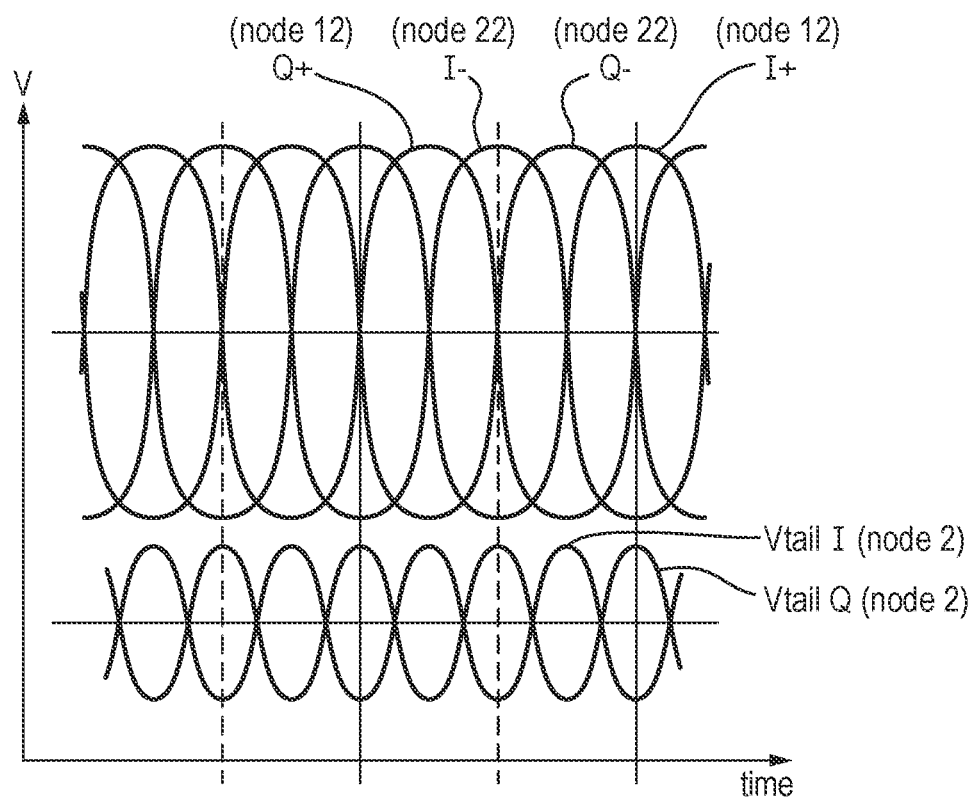
Figure 7:
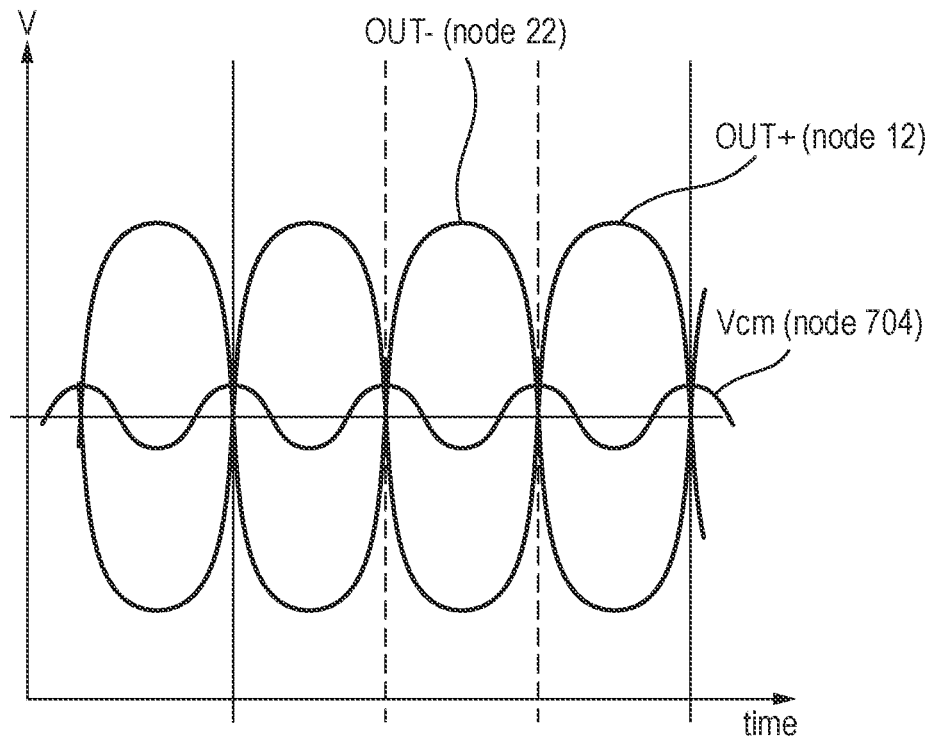
Figure 8:
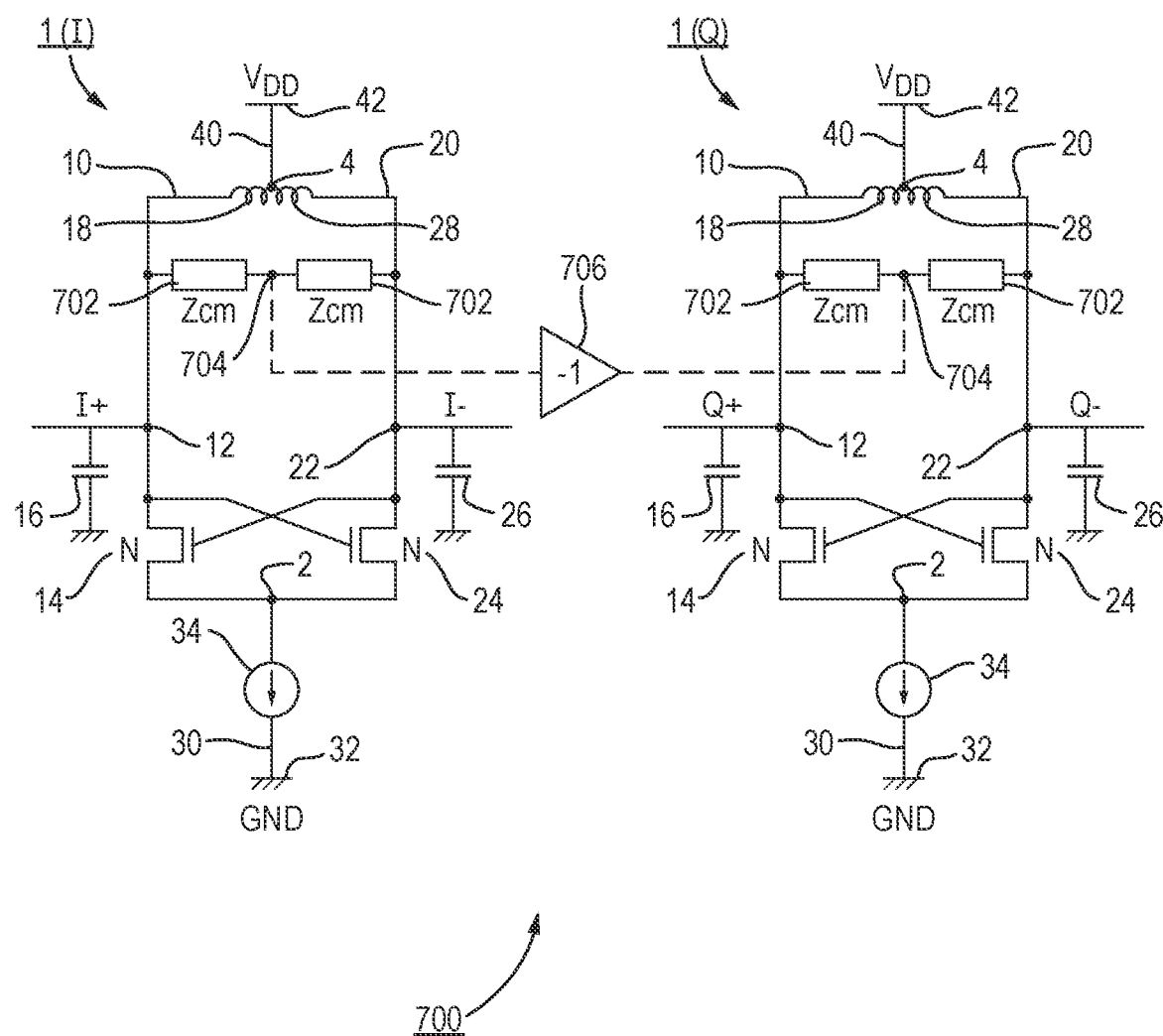
Figure 9:
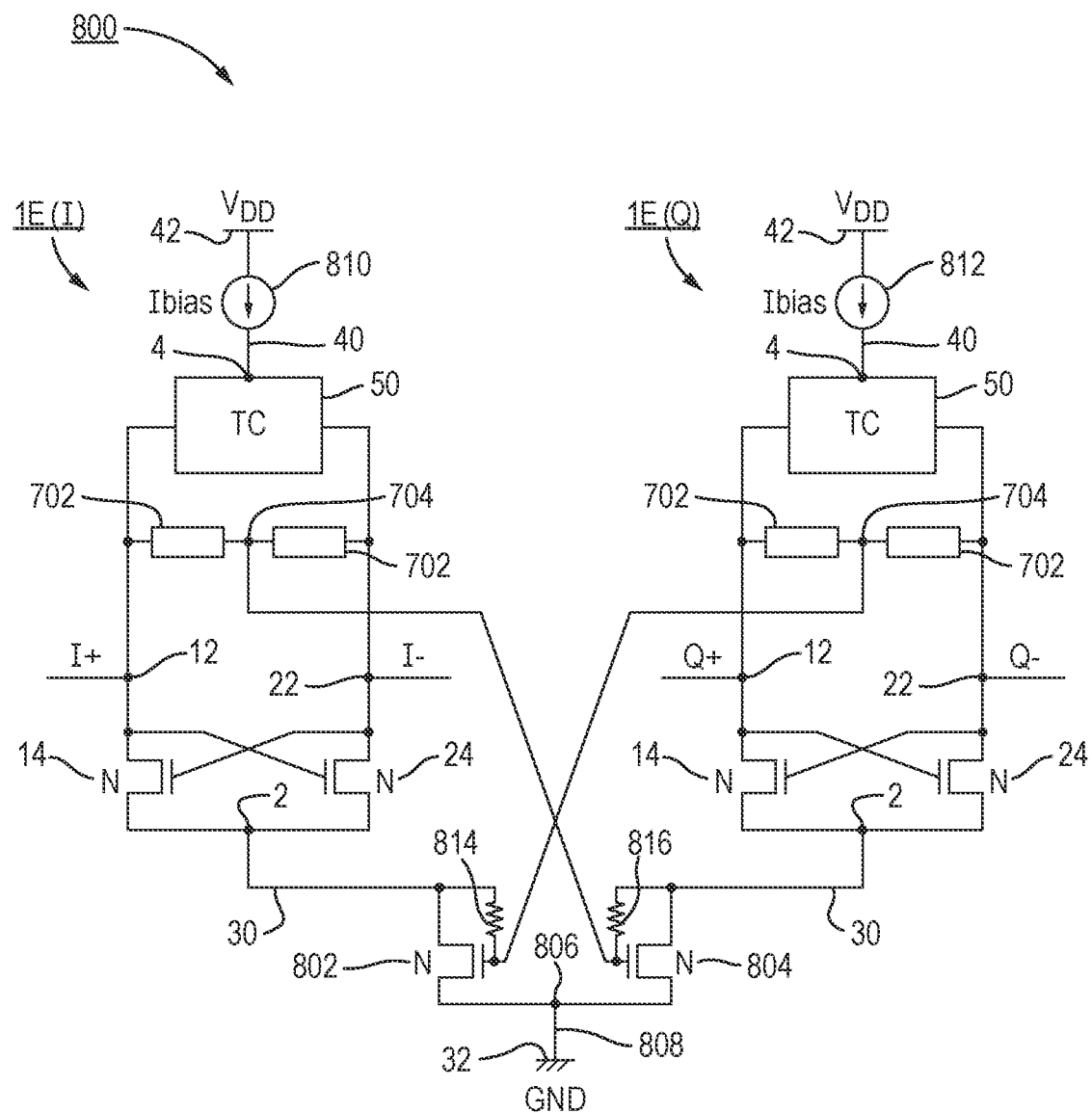
Figure 10:
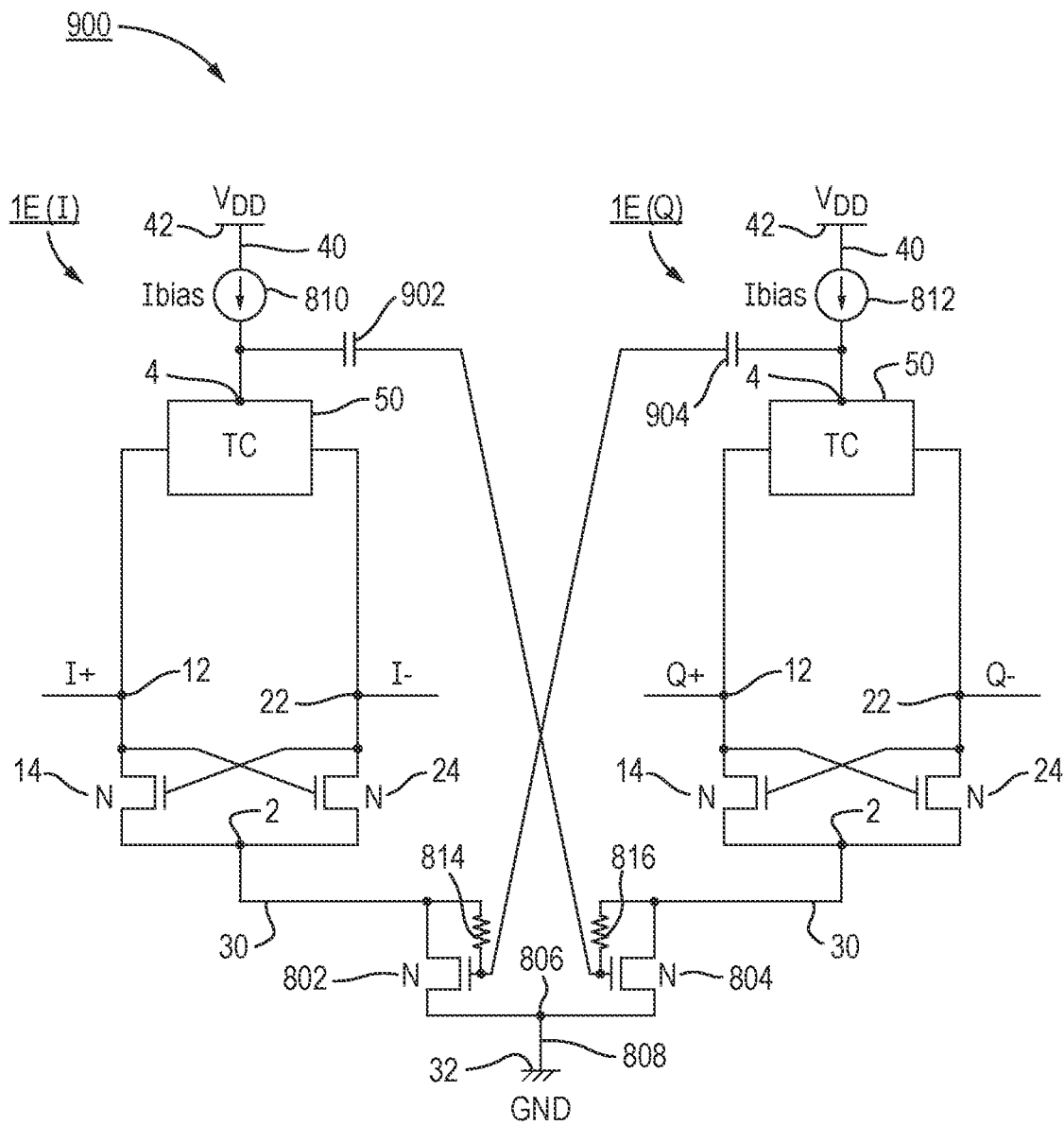
Figure 11:
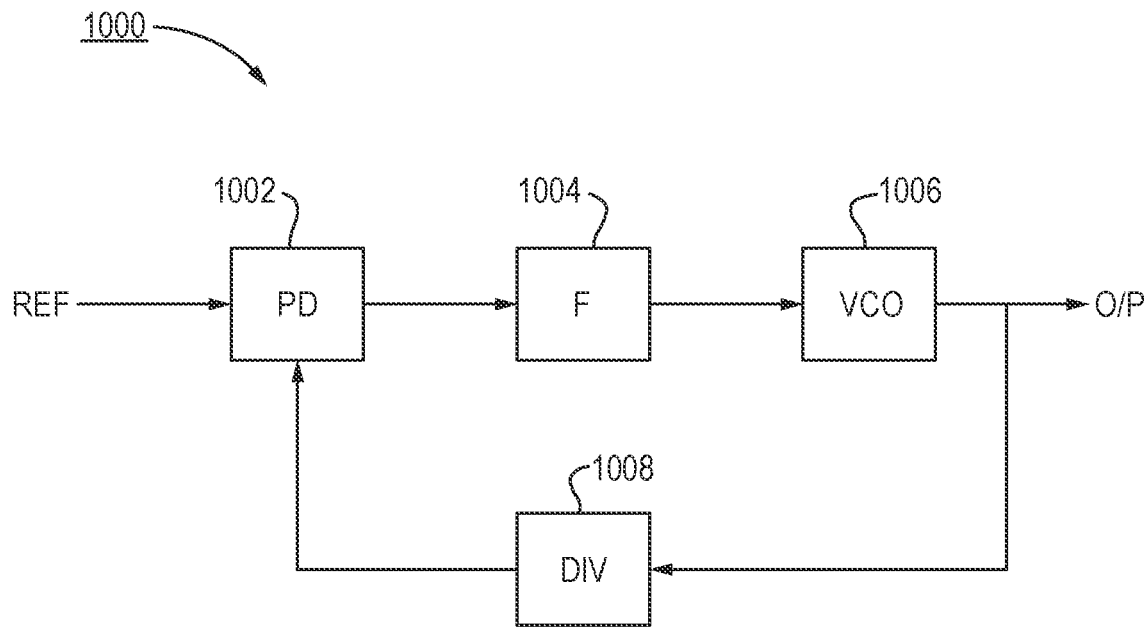
Figure 12:
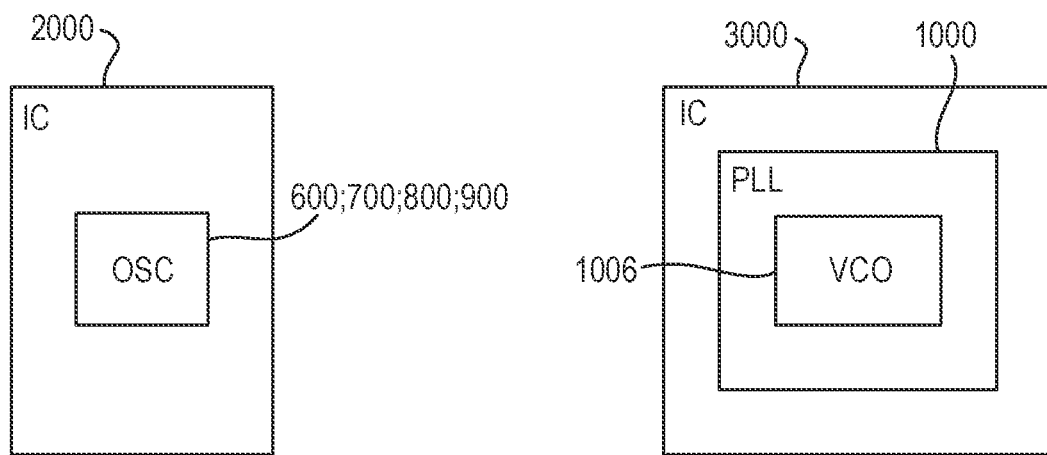

FIG. 7 presents two graphs showing voltage waveforms of differential oscillator circuits similar to those of FIG. 3;

FIG. 8 is a schematic circuit diagram of quadrature oscillator circuitry embodying the present invention;

FIG. 9 is a schematic circuit diagram of quadrature oscillator circuitry embodying the present invention;

FIG. 10 is a schematic circuit diagram of quadrature oscillator circuitry embodying the present invention;

FIG. 11 is a schematic circuit diagram of PLL circuitry embodying the present invention; and FIG. 12 is a schematic circuit diagram of integrated circuitry embodying the present invention.

Before considering embodiments of the present invention, a number of previously-considered circuit arrangements and related analysis will be considered.

FIG. 3 presents two graphs showing voltage waveforms of differential oscillator circuits by way of example.

The upper graph shows voltage waveforms for the differential oscillator circuit 1 (as an example differential oscillator circuit of those of FIG. 1), along with an indication of the nodes of the circuit to which the waveforms apply. The waveforms OUT+, OUT− are thus voltage waveforms taken at the output nodes 12 and 22, respectively. The waveform Vtail is a voltage waveform taken at the first tail node 2. Assuming that the LC tank circuit of the differential oscillator circuit 1 is tuned to have a resonant frequency $f_0$, so that the waveforms OUT+, OUT− have the frequency $f_0$, it can be seen that there is a component at double the resonant frequency, i.e. at $2f_0$, at the first tail node 2. The waveform Vtail thus peaks at the "zero-crossings" of the differential output swing OUT+, OUT−.

The lower graph shows the same voltage waveforms as the upper graph, but for two instances of the differential oscillator circuit 1, which may be referred to as differential oscillator circuit 1(I), being an I-side oscillator circuit, and differential oscillator circuit 1(Q), being a Q-side oscillator circuit. It is also assumed that the differential oscillator circuits 1(I) and 1(Q) are operating in quadrature so that their output differential oscillator signals may be referred to as I+ and I−, corresponding to OUT+ and OUT− for circuit 1(I), and Q+ and Q−, corresponding to OUT+ and OUT− for circuit 1(Q), where I+, I−, Q+ and Q− are a set of quadrature signals.

The waveforms I+ and I− are thus voltage waveforms taken at the output nodes 12 and 22 of circuit 1(I), respectively, and the waveforms Q+ and Q− are voltage waveforms taken at the output nodes 12 and 22 of circuit 1(Q), respectively. The waveform Vtail I is taken at the first tail node 2 of circuit 1(I) and the waveform Vtail Q is taken at the first tail node 2 of circuit 1(Q). Again, it is assumed that the LC tank circuits (LC tanks) of the circuits 1(I) and 1(Q) are tuned to have a resonant frequency $f_0$. The components at $2f_0$ for the two circuits 1(I) and 1(Q), i.e. Vtail I and Vtail Q, then form a differential pair as indicated. It therefore follows that if the waveforms at the first tail nodes 2 of the circuits 1(I) and 1(Q) are "forced" (or urged) to be differential, then quadrature operation can be achieved, i.e. where I+, I−, Q+ and Q− form a set of quadrature signals.

Figure 4:
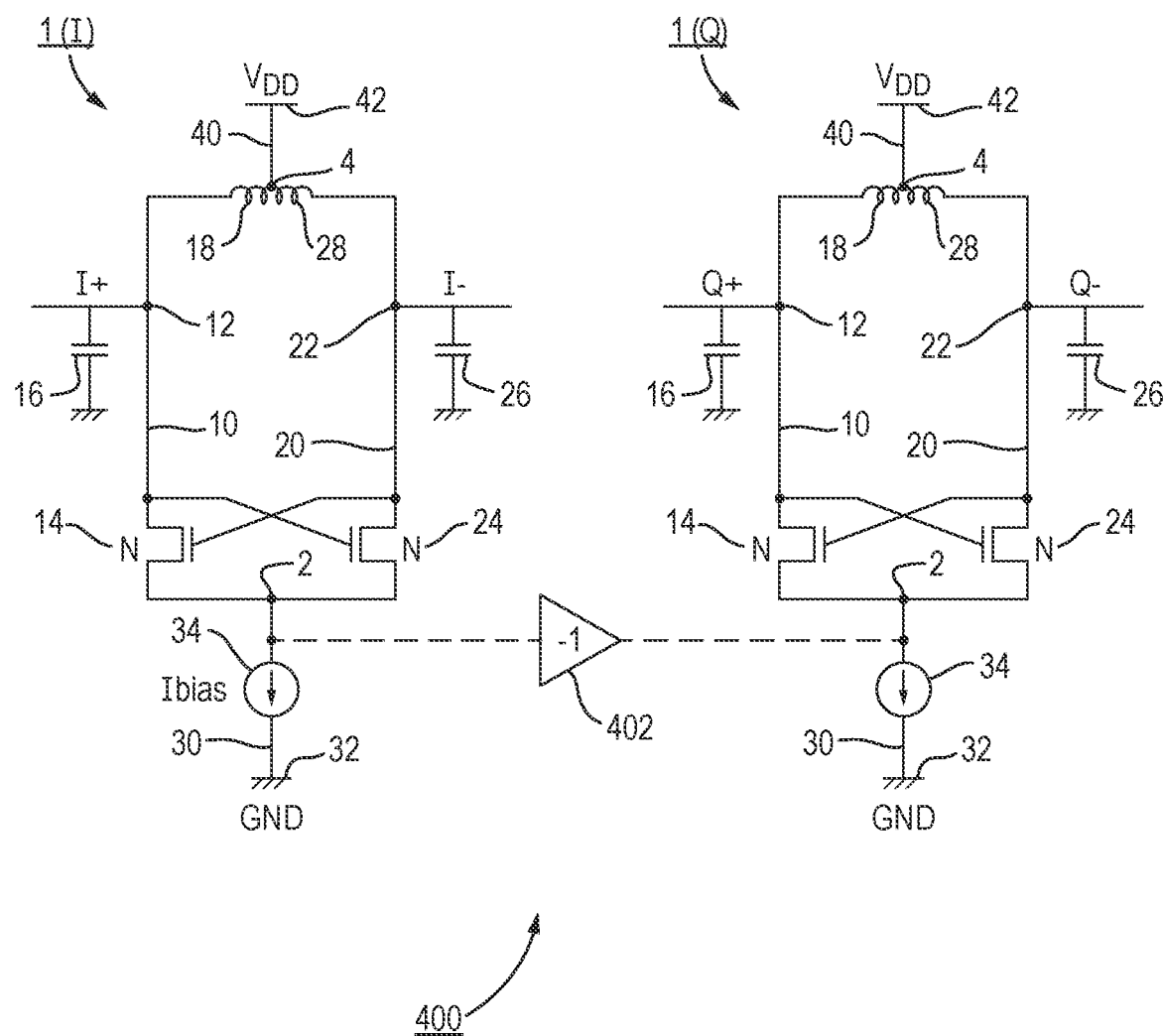
FIG. 4 is a schematic circuit diagram of previously-considered quadrature oscillator circuitry.

FIG. 4 is a schematic diagram showing differential oscillator circuits 1(I) and 1(Q) as discussed above. As before, like elements are denoted by like reference signs and thus the differential oscillator circuits 1(I) and 1(Q) will be understood based on the description of differential oscillator circuit 1 of FIG. 1 above. Together, the differential oscillator circuits 1(I) and 1(Q) constitute quadrature oscillator circuitry 400, in particular by virtue of the inverting amplifier 402 shown schematically as coupling the first tail nodes 2 of the two circuits 1(I) and 1(Q) together, so as to force the waveforms at those tail nodes 2 to be differential. Although the inverting amplifier 402 coupling may appear one-way coupling from FIG. 4, the coupling may be considered two-way so that the inverting amplifier 402 coupling is an inverting amplifier cross-coupling.

Figure 5:
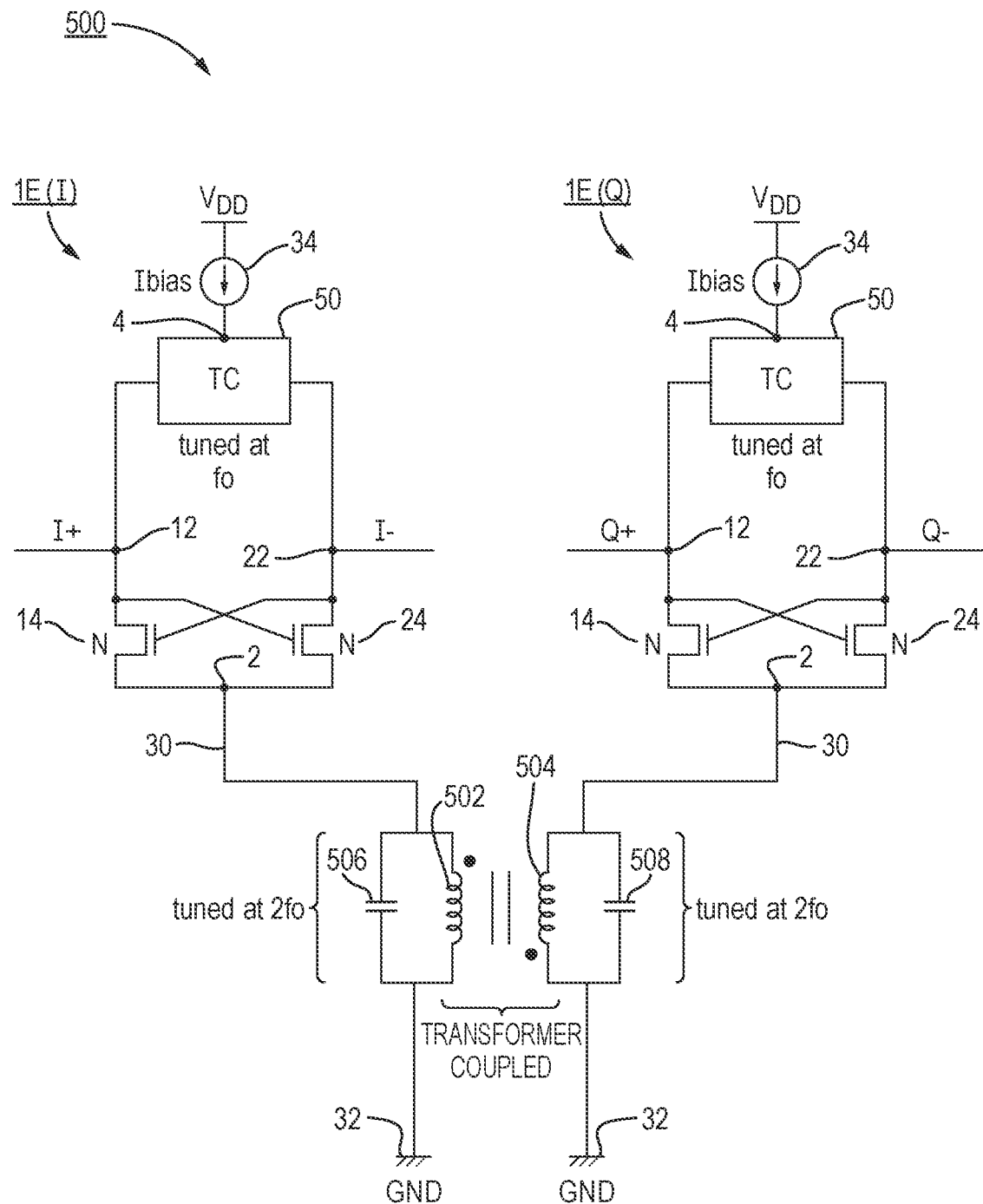
FIG. 5 is a schematic circuit diagram of previously-considered quadrature oscillator circuitry.

FIG. 5 is a schematic diagram of previously-considered quadrature oscillator circuitry 500 being an example implantation of the quadrature oscillator circuitry 400. Here, the circuits 1(I) and 1(Q) represented as equivalent circuits 1E(I) and 1E(Q), respectively, in line with circuit 1E of FIG. 1, for simplicity. Again, like elements are denoted with like reference signs and duplicate description is omitted.

As shown in FIG. 5, the inverting amplifier 402 coupling is implemented by providing transformer coils 502 and 504 along the first tail current paths 30 of the circuits 1E(I) and 1E(Q), respectively, along with respective parallel capacitors 506 and 508. The tank circuits (TC) 50 are tuned at the resonant frequency $f_0$ as before, and thus the parallel connected coils and capacitors 502 and 506, and 504 and 508, are tuned at twice that frequency (i.e. at $2f_0$) in line with FIG. 3. As indicated by the transformer dot notation (following the well-known dot convention), the transformer coils 502 and 504 (serving as primary and secondary transformer coils) are coupled to form a transformer which supplies a gain of −1. This causes the signals at the tail nodes 2 to be differential (see the lower graph of FIG. 3), and thus the desired quadrature operation is achieved.

However, implementing such transformers in integrated circuitry, for example on an IC chip, with identical primary and secondary turns, is complicated and requires a large area.

Figure 6:
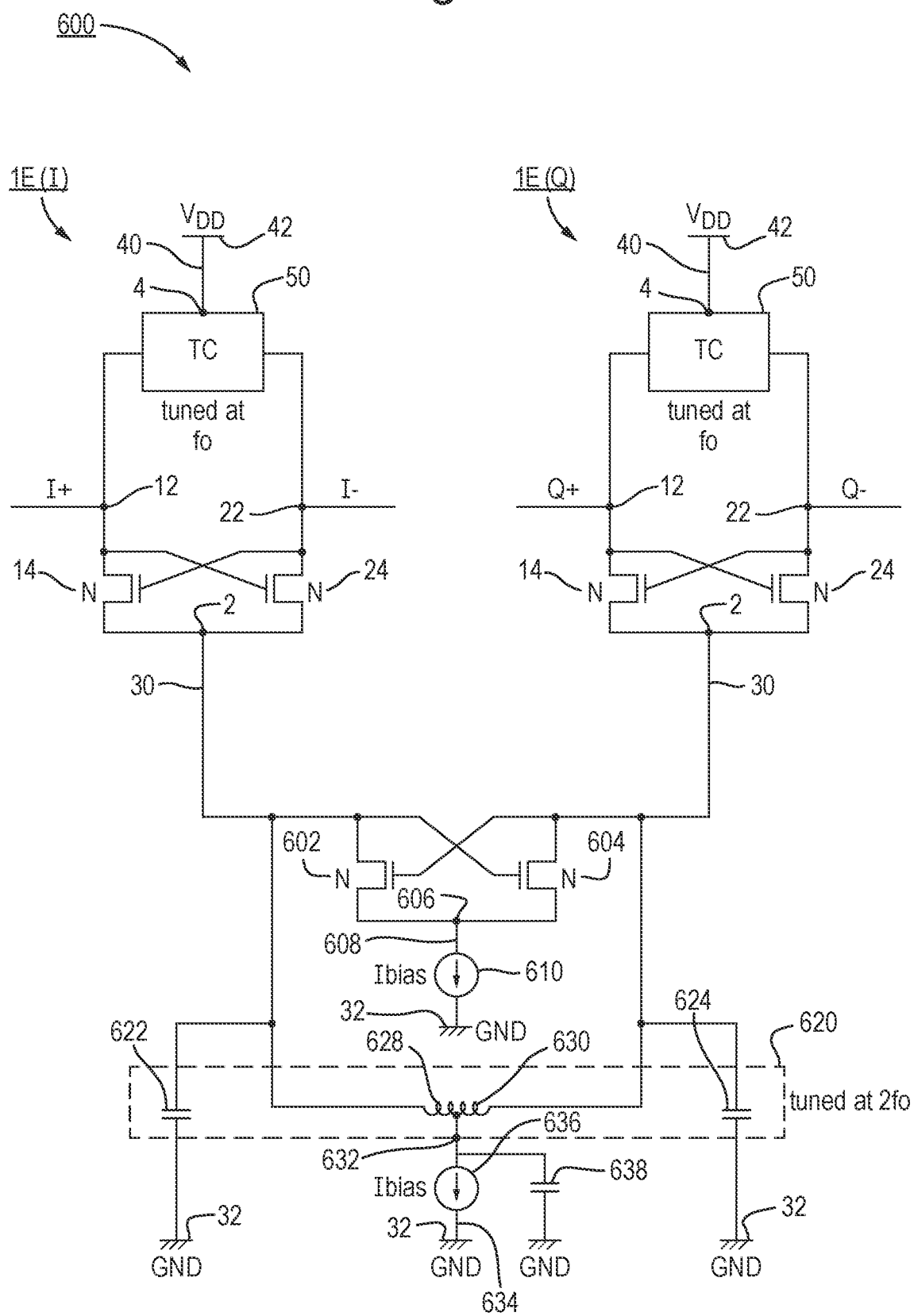
FIG. 6 is a schematic circuit diagram of quadrature oscillator circuitry embodying the present invention.

FIG. 6 is a schematic diagram of quadrature oscillator circuitry 600 also being an implementation of the quadrature oscillator circuitry 400 using circuits 1E(I) and 1E(Q) as in FIG. 5, but with an improved implementation of the inverting amplifier 402 coupling.

Again, like elements are denoted with like reference signs and duplicate description is omitted. Quadrature oscillator circuitry 600 embodies the present invention.

As shown in FIG. 6, the inverting amplifier 402 coupling is implemented by providing cross-coupled transistor 602 and 604, in this case NMOS FETs, along the respective first tail current paths 30, which current paths 30 are configured to meet at a shared tail node 606. A shared tail current path 608 (shared by both current paths 30) connects the shared tail node 606 to a shared voltage-source node being the first voltage-source node 32, in this case ground supply (GND). A shared current source 610 is provided along the shared tail current path 608 to regulate or control a bias current Ibias flowing along that path (and thus a combination of the currents flowing along the two current paths 30). As such, the individual current sources 34 are not needed. The shared current source 610 could be replaced with an impedance such as a resistor.

The source terminals of the transistors 602, 604 are connected to the shared tail node 606 and their drain terminals are connected to the respective first tail nodes 2, such that their channels form respective parts of the respective first tail current paths 30. The gate terminals of the transistors 602 and 604 are connected to each other's drain terminals. The cross-coupled transistors 602 and 604 act as cross-coupled inverting amplifiers, forcing the waveforms at the respective first tail nodes 2 to be differential.

Also provided is an auxiliary LC tank circuit 620 which serves to focus the gain of the cross-coupled pair of transistors 602, 604 at the desired frequency $2f_0$ (see FIG. 3), prevent large gain at DC (i.e. at 0 Hz), and also avoid or reduce oscillation at an (unwanted) parasitic frequency as with e.g. a relaxation oscillator. The LC tank circuit 620 is connected between the first nodes 2 or between the first tail current paths 30, effectively in parallel with the cross-coupled transistors 602, 604.

The LC tank circuit 620 comprises auxiliary capacitors 622 which connect the respective first tail nodes 2 to the voltage-source node 32, in this case to ground supply (GND). Further, auxiliary inductors 628 and 630 connect the respective first tail nodes 2 to an auxiliary shared tail node 632 along respective auxiliary tail current paths. An auxiliary shared tail current path 634 connects the auxiliary shared tail node 632 to an auxiliary shared voltage-source node, in this case being the first voltage source-node 32, i.e. ground supply (GND). An auxiliary shared current source 636 is provided along the auxiliary shared tail current path 634 to regulate or control a bias current Ibias flowing along that path. A capacitor 638 is connected in parallel with the current source 636 (e.g. between the node 632 and GND) so as to filter out noise from the current source 636.

The inductors 628, 630 may be implemented together as a centre-tapped inductor (winding/coil) whose centre tap (i.e. contact) is connected to node 632 and whose respective ends are connected to the first tail nodes 2, as shown in FIG. 6. Such a centre-tapped inductor may be referred to as a differential inductor. The decoupling capacitor 638 is used to AC ground the centre tap.

The auxiliary shared current source 636 could be replaced with an impedance such as a resistor.

Along with the auxiliary LC tank circuit 620 being tuned at $2f_0$, the LC tank circuits 50 are tuned at $f_0$ as before. Thus, the desired quadrature operation is achieved (see FIG. 3), but without needing the transformer of FIG. 5.

The differential inductor is much easier to implement compared to transformers (see FIG. 5) and has more compact area and a higher Q-factor. Moreover, the current used in the added differential pair of transistors 602, 604 flows also via the first tail nodes 2 (i.e. via the cores of the two differential oscillator circuits), thus contributing to the gain and swing of the quadrature output signals I+, I−, Q+, Q−. It will be appreciated that the same applies to the embodiments disclosed later herein.

The inventors have also considered other ways to implement quadrature oscillator circuitry. In this regard, reference is made to FIGS. 7 and 8.

Starting first with FIG. 8, there is shown a schematic diagram of quadrature oscillator circuitry 700, embodying the present invention, which is the same as quadrature oscillator circuitry 400 of FIG. 4, except that the inverting amplifier 402 has been removed. Instead, in each of the circuits 1(I) and 1(Q) of FIG. 8, a pair of impedances 702 are connected in series between the two parallel current paths 10, 20 (effectively between the output nodes 12, 22) so as to define a common-mode node 704 therebetween at which a common-mode voltage signal is generated. The impedances 702 could for example be, or comprise, capacitors. An inverting amplifier 706 is connected between the common-mode nodes 704. As before, like elements are denoted with like reference signs between FIGS. 4 and 8 so that duplicate description is omitted.

FIG. 7 presents two graphs which are the same as those in FIG. 3 except that the Vtail waveforms taken at the relevant first tail nodes 2 have been replaced with Vcm waveforms (common-mode waveforms) taken at the relevant common-mode node 704.

Thus, in the upper graph, which represents a single differential oscillator circuit 1, the common-mode voltage waveform Vcm is equivalent to one taken at node 704 in circuit 1(I) of FIG. 8. Assuming again that the LC tank circuit of the circuit 1 (and 1(I)) is tuned to have a resonant frequency $f_0$, it can be seen that there is component (i.e. Vcm) at double the resonant frequency, i.e. at $2f_0$, at the common-mode nodes 704. The waveform Vcm thus peaks at the "zero-crossings" of the differential output swing OUT+, OUT−.

In the lower graph, which corresponds to the pair of differential oscillator circuits 1(I) and 1(Q) in FIG. 8, the common-mode voltage waveforms Vcm-I and Vcm-Q are taken at the nodes 704 of the differential oscillator circuits 1(I) and 1(Q), respectively. Again, it is assumed that the LC tank circuits of the circuits 1(I) and 1(Q) are tuned to have a resonant frequency $f_0$. The components at $2f_0$ for the two circuits 1(I) and 1(Q), i.e. Vcm-I and Vcm-Q, then form a differential pair as indicated.

It therefore follows that if the waveforms at the common-mode nodes 704 of the circuitry 1(I) and 1(Q) are forced (or urged) to be differential, then quadrature operation can be achieved, i.e. where I+, I−, Q+, Q− form a set of quadrature signals. The connection of the inverting amplifier 706 between the common-mode nodes 704 of the circuits 1(I) and 1(Q) in FIG. 8 serves to create this operation. Although the inverting amplifier 802 coupling may appear one-way coupling from FIG. 8, the coupling may be considered two-way so that the inverting amplifier 802 coupling is an inverting amplifier cross-coupling.

Figure 1:
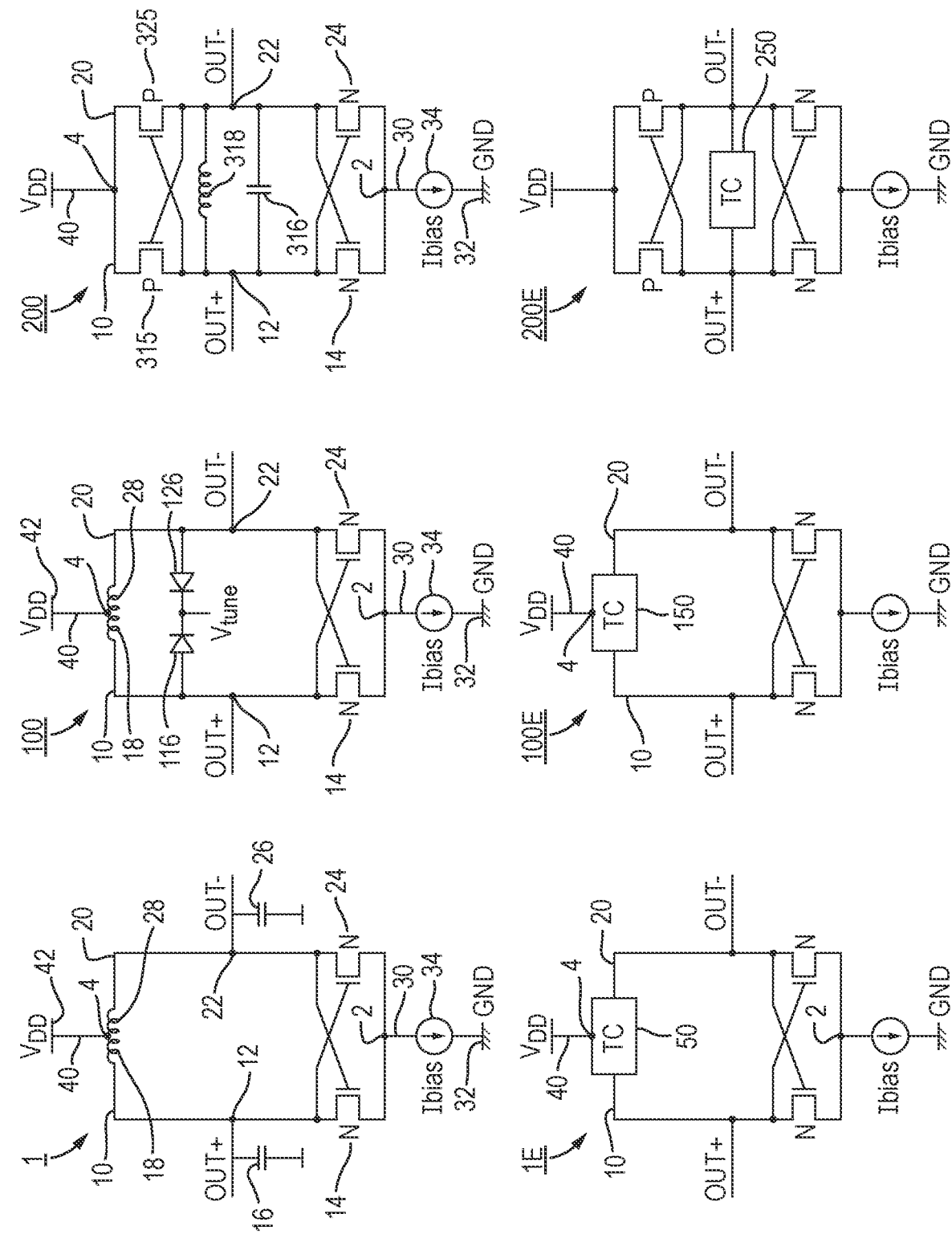
Figure 2:
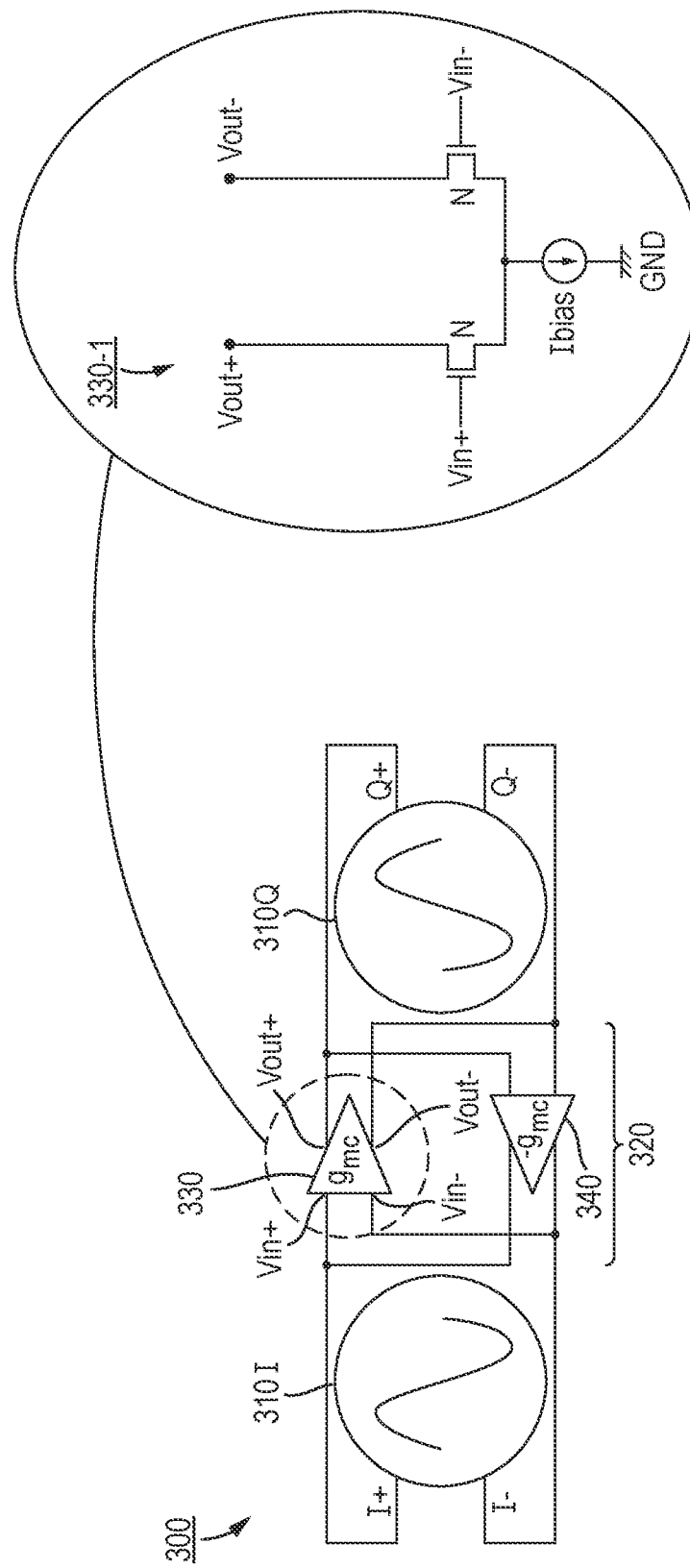

Of course, it will be appreciated that such common-mode nodes 704 could be provided in a similar way for pairs of the other differential oscillator circuits shown in FIG. 1, for example, and the waveforms at those nodes controlled with an inverting amplifier arrangement as with inverting amplifiers 706 in FIG. 8, to arrive at other embodiments of the present invention. The present disclosure will be understood accordingly.

FIG. 9 is a schematic diagram of quadrature oscillator circuitry 800 embodying the present invention, being an implementation of the quadrature oscillator circuitry 700, with the circuits 1(I) and 1(Q) represented as equivalent circuits 1E(I) and 1E(Q), respectively, in line with circuit 1E of FIG. 1. Again, like elements are denoted with like reference signs and duplicate description is omitted.

As shown in FIG. 9, the inverting amplifier coupling 706 is implemented by providing cross-coupled transistors 802 and 804, in this case NMOS FETs, along the respective first tail current paths 30 which current paths 30 are configured to meet at a shared tail node 806. A shared tail current path 808 (shared by both current paths 30) connects the shared tail node 806 to a shared voltage-source node being the first voltage-source node 32, in this case ground supply (GND).

Current sources 810, 812 are provided along the second current paths 40 as indicated, to regulate or control respective bias currents Ibias flowing along those paths. As such, the current sources 34 are not needed. The current sources 810, 812 could each be replaced with an impedance such as a resistor, but of course in this case the bias current would not be regulated.

The source terminals of the transistors 802, 804 are connected to the shared tail node 806 and their drain terminals are connected to the respective first tail nodes 2, such that their channels form respective parts of the respective first tail current paths 30. The gate terminals of the transistors 802 and 804 are connected to the common-mode nodes 704 of each other's differential oscillator circuit. That is, the gate terminal of the transistor 802 is connected to the common-mode node 704 of the circuit 1E(Q) and the gate terminal of the transistor 804 is connected to the common-mode node 704 of the circuit 1E(I). In this sense, the transistors 802 and 804 are cross-coupled. Recall that the impedances 702 may be capacitors. With this in mind, the gate terminals of the transistors 802, 804 are coupled by respective resistors 814, 816 to their drain terminals to DC bias (self-bias) their gate voltages. Thus, at DC the transistors 802, 804 are diode-connected. Of course, the gate terminals of the transistors 802 and 804 could be resistor coupled to a voltage-source node instead for similar reasons.

At $2f_0$ the transistors 802, 804 operate as a cross-coupled pair, i.e. as cross-coupled inverting amplifiers, forcing a differential AC current signal into the circuits 1E(I) and 1E(Q), which in turn forces the waveforms at the respective common-mode nodes 704 to be differential. Thus, the desired quadrature operation is achieved (see FIG. 7).

Again, the current used in the added differential pair of transistors 802, 804 flows also via the first tail nodes 2 (i.e. via the cores of the two differential oscillator circuits), thus contributing to the gain and swing of the quadrature output signals I+, I−, Q+, Q−. That is, the differential pair of transistors 802, 804 reuse the current flowing through the two differential oscillator circuits and no extra current is needed. Further, the FIG. 9 embodiment is smaller in terms of needed circuit area as compared to the FIG. 6 embodiment.

FIG. 10 is a schematic diagram of quadrature oscillator circuitry 900 embodying the present invention, being another implementation of the quadrature oscillator circuitry 700, with the circuits 1(I) and 1(Q) represented as equivalent circuits 1E(I) and 1E(Q), respectively, in line with circuit 1E of FIG. 1.

The FIG. 10 embodiment is similar to the FIG. 9 embodiment, and as such like elements are denoted with like reference signs and duplicate description is omitted.

The difference between quadrature oscillator circuitry 900 and quadrature oscillator circuitry 800 is that the impedances 702 (and thus nodes 704) have been removed. The gate terminals of the transistors 802 and 804 are connected to the second tail nodes 4 of each other's differential oscillator circuit (which serve as common-mode nodes) via respective capacitors 902, 904, rather than to nodes 704. That is, the gate terminal of the transistor 802 is connected to the second tail node 4 of the circuit 1E(Q) via capacitor 904, and the gate terminal of the transistor 804 is connected to the second tail node 4 of the circuit 1E(I) via capacitor 902. In this sense, the transistors 802 and 804 are cross-coupled in FIG. 10.

Given the capacitors 902, 904, the gate terminals of the transistors 802, 804 are coupled by respective resistors 814, 816 to their drain terminals to DC bias (self-bias) their gate voltages and similar considerations apply as in FIG. 9. Of course, the gate terminals of the transistors 802 and 804 could be resistor coupled to a voltage-source node instead for similar reasons.

Again, at $2f_0$ the transistors 802, 804 operate as a cross-coupled pair, i.e. as cross-coupled inverting amplifiers, forcing a differential AC current signal into the circuits 1E(I) and 1E(Q), which in turn forces the waveforms at the respective common-mode nodes (in this case, the second tail nodes 4) to be differential. Thus, the desired quadrature operation is achieved (see FIG. 7). It will be appreciated that other nodes along the second tail current paths 40 could serve as the common-mode nodes.

Again, the current used in the added differential pair of transistors 802, 804 flows also via the first tail nodes 2 (i.e. via the cores of the two differential oscillator circuits), thus contributing to the gain and swing of the quadrature output signals I+, I−, Q+, Q−. That is, the differential pair of transistors 802, 804 reuse the current flowing through the two differential oscillator circuits and no extra current is needed. Further, the FIG. 10 embodiment is smaller in terms of needed circuit area as compared to the FIG. 6 embodiment.

It will be appreciated that the waveforms at such common-mode nodes 704 and 4 could be utilised in a similar way for pairs of the other differential oscillator circuits shown in FIG. 1, for example, and controlled with an inverting amplifier arrangement as in FIGS. 9 and 10 to arrive at other embodiments of the present invention. The present disclosure will be understood accordingly.

FIG. 11 is a schematic diagram of phase lock loop (PLL) circuitry 1000 embodying the present invention.

The PLL circuitry comprises a phase detector 1002, a (low-pass) filter 1004, a VCO 1006 and a divider 1008, connected together as shown in FIG. 11. The VCO may be implemented using any of the quadrature oscillator circuitry embodiments disclosed herein, bearing in mind that the differential oscillator circuits of those quadrature oscillator circuitry embodiments may be implemented in many different ways as exemplified by way of the range of circuits depicted in FIG. 1.

The skilled reader will understand the basic operation of PLL circuitry such as that depicted in FIG. 11. Nevertheless, as a brief summary, the VCO 1006 generates the output signal O/P and the phase detector 1002 compares the phase of that output signal O/P (as divided by the divider 1008) with the phase of an input (periodic) reference signal REF. The output of the phase detector 1002 depends on the detected phase difference and is filtered by the filter 1004 before being input to the VCO 1006 to control the frequency of the output signal O/P. In the present case, the output signal O/P may be considered to be a quadrature output signal in line with the quadrature oscillator circuitry embodiments considered above, however the phase detector 1002 may be supplied (via the divider 1008) with just one of the four oscillator signals which make up the quadrature output signal.

Of course, FIG. 11 depicts just one possible PLL topology and the present invention extends to any PLL topology where its VCO is implemented using any of the quadrature oscillator circuitry embodiments disclosed herein.

Any of the circuitry disclosed herein may be implemented as integrated circuitry, for example as (or as part of) and IC chip, such as a flip chip. FIG. 12 is a schematic diagram of integrated circuitry 2000 and 3000 embodying the present invention.

Integrated circuitry 2000 and 3000 may be representative of some or all of an IC chip. Integrated circuitry 2000 comprises quadrature oscillator circuitry according to the present invention, for example quadrature oscillator circuitry 600, 700, 800 or 900. Integrated circuitry 3000 comprises PLL circuitry according to the present invention, for example PLL circuitry 1000 which comprises VCO 1006. VCO 1006 may be implemented as quadrature oscillator circuitry 600, 700, 800 or 900, albeit with e.g. the L or C elements of their tank circuits adapted to be controlled with voltage control as explained earlier.

The present invention extends to integrated circuitry and IC chips as mentioned above, circuit boards comprising such IC chips, and communication networks (for example, internet fiber-optic networks and wireless networks) and network equipment of such networks, comprising such circuit boards. It will be appreciated that PLL circuitry (that has quadrature outputs) may be employed in various applications where clocking is required. The present invention extends to such applications, and examples include, but are not limited to, analogue-to-digital converters (ADCs), digital-to-analogue converters (DACs), Serializer/Deserializer circuits (SERDES), Clock Data Recovery circuits (CDRs), Wireless Transceivers, Processors and related clocking circuitry, etc.

The present invention may be embodied in many different ways in the light of the above disclosure, within the spirit and scope of the appended claims.

The invention claimed is:

1. Quadrature oscillator circuitry, comprising:
   first and second differential oscillator circuits, each differential oscillator circuit comprising first and second tail nodes, a pair of output nodes, and a pair of parallel current paths which extend in parallel between its first and second tail nodes via its output nodes, respectively, and each differential oscillator circuit configured to generate a pair of differential oscillator signals at its respective output nodes; and
   a cross-coupling circuit comprising first and second transistors connected to cross-couple the differential oscillator circuits,
   wherein:
   for each of the differential oscillator circuits, a first tail current path connects the first tail node to a first voltage-source node and a second tail current path connects the second tail node to a second voltage-source node, one of the first and second voltage-source nodes for connection to a high-voltage source and the other of the first and second voltage-source nodes for connection to a low-voltage source;
   the first and second transistors are connected to form respective parts of the first tail current paths of the differential oscillator circuits, respectively, so that current flowing along the respective first tail current paths flows through the respective transistors;
   the gate or base terminals of the first and second transistors are connected to the first tail nodes of the second and first differential oscillator circuits, respectively, so that they are controlled by voltage signals produced at the first tail nodes of the second and first differential oscillator circuits, respectively;
   the first tail current paths extend from the first tail nodes via the first and second transistors, respectively, to a shared tail node;
   a shared tail current path connects the shared tail node to a shared voltage-source node, being the first voltage-source node of both of the differential oscillator circuits;
   each of said differential oscillator circuits comprises an LC tank circuit configured to have a target resonant frequency; and
   the quadrature oscillator circuitry comprises an auxiliary LC tank circuit shared by the differential oscillator circuits and configured to have a resonant frequency which is substantially twice the target resonant frequency.

2. The quadrature oscillator circuitry as claimed in claim 1, wherein:
   the first and second transistors are connected as a cross-coupled pair of transistors; and/or
   the auxiliary LC tank circuit is connected between the first tail nodes or the first tail current paths of the differential oscillator circuits; and/or
   the auxiliary LC tank circuit is connected in parallel with the cross-coupled pair of transistors.

3. The quadrature oscillator circuitry as claimed in claim 1, wherein:
   a shared current source or impedance forms part of the shared tail current path, the shared current source configured to regulate a bias current flowing along that current path.

4. The quadrature oscillator circuitry as claimed in claim 1, comprising an auxiliary shared tail node, wherein:
   for each of the differential oscillator circuits, an auxiliary tail current path forms part of the auxiliary LC tank circuit and connects the first tail node to the auxiliary shared tail node via an auxiliary impedance; and
   an auxiliary shared tail current path connects the auxiliary shared tail node to an auxiliary shared voltage-source node,
   optionally wherein:
   an auxiliary shared current source forms part of the auxiliary shared tail current path and is configured to regulate a bias current flowing along that current path; and/or
   the auxiliary impedances are or comprise inductors; and/or
   the auxiliary impedances are implemented together as a centre tapped inductor whose centre tap is the auxiliary shared tail node.

5. The quadrature oscillator circuitry as claimed in claim 1, wherein the auxiliary LC tank circuit comprises a pair of first-node capacitors connecting the first tail nodes, respectively, to a voltage-source node.

6. Phase lock loop circuitry comprising the quadrature oscillator circuitry as claimed in claim 1.

7. Integrated circuitry, comprising the quadrature oscillator circuitry as claimed in claim 1.

8. Integrated circuitry, comprising the phase lock loop circuitry as claimed in claim 6.

* * * * *